United States Patent [19]

Blum

[11] Patent Number: 5,006,807
[45] Date of Patent: Apr. 9, 1991

[54] METHOD FOR DETERMINING UNDERSHOOT RESISTANCE OF AN ELECTRONIC DEVICE

[76] Inventor: Steven M. Blum, 3586 Ridge Blvd., Palm Harbor, Fla. 34684

[21] Appl. No.: 290,614

[22] Filed: Dec. 27, 1988

[51] Int. Cl.$^5$ ............................................. G01R 31/28
[52] U.S. Cl. .................................. 324/537; 324/72.5; 371/15.1
[58] Field of Search ................ 324/73 R, 537, 73 PC; 371/15, 25, 15.1

[56] References Cited

U.S. PATENT DOCUMENTS

| | | | |
|---|---|---|---|
| 3,531,718 | 9/1970 | Hamilton et al. | 324/537 X |
| 4,096,402 | 6/1978 | Schroeder et al. | 307/362 |
| 4,268,785 | 5/1981 | Svendsen | 318/620 |
| 4,694,242 | 9/1987 | Peterson et al. | 324/73 R |
| 4,749,882 | 6/1988 | Morgan | 307/263 |
| 4,791,359 | 12/1988 | Raymond et al. | 324/73 R |
| 4,800,332 | 1/1989 | Hutchins | 324/73 R |
| 4,837,502 | 6/1989 | Ugenti | 324/537 X |

*Primary Examiner*—Reinhard J. Eisenzopf
*Assistant Examiner*—Jack B. Harvey

[57] ABSTRACT

A method for determining the undershoot resistance of an electronic device having input and output pins. The method comprises the steps of selecting an input pin to test, providing a high voltage to at least one nonselected input pin, applying a negative voltage spike to the selected input pin, and monitoring output pins not logically connected to the input pin for disturbances in their output voltage levels. The high voltage, and the amplitude and pulse width of the negative voltage spike are incrementally changed and, of any pin has a disturbance in its output voltage, are recorded.

17 Claims, 4 Drawing Sheets

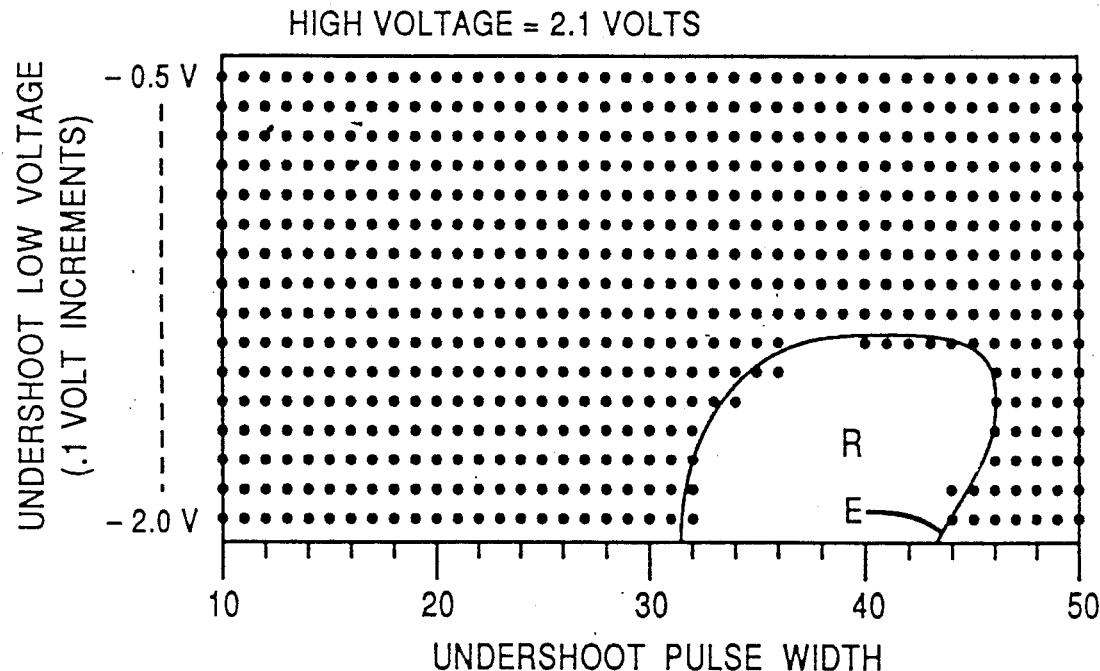

METHOD FOR DETERMINING UNDERSHOOT RESISTANCE OF AN ELECTRONIC DEVICE

The present invention relates to methods for testing electronic devices, and, more particularly, it relates to a method for determining the undershoot resistance of an electronic device.

BACKGROUND OF THE INVENTION

As the speed of digital electronic circuits has increased, certain physical effects that could previously be ignored have become more significant. One such effect is known as "undershoot". Undershoot is a sensitivity to negative voltage transients appearing at an input to the device. Undershoot is caused by an excessive positive current drain from outputs which are not logically connected to the input subjected to the transient. As expected, a negative voltage spike appearing at an input to a device will cause a voltage fluctuation or glitch at an output logically connected thereto. However, under certain conditions, the negative voltage spike will draw current from other parts of the device such as collector regions which can create glitches in outputs not logically connected to the input pin having the spike.

A typical circuit that might exhibit an undershoot sensitivity is a programmable array logic (PAL) device. A PAL will normally have a plurality of input pins and a plurality of output pins, some of which output and input pins are not logically connected. A functional undershoot failure occurs when a negative voltage spike appears on an input pin and one or more output pins which are not logically connected to that input pin glitch. Such a glitch may be characterized by an ephemeral or indefinite change in logic level appearing on the pin in question.

The ability of an electronic device to absorb negative transient spikes is known as undershoot tolerance or resistance. At present there does not appear to be adequate methods for analyzing and/or testing electronic devices for undershoot resistance.

OBJECTS OF THE INVENTION

It is therefore an object of the present invention to provide a new and improved method for determining the undershoot resistance of an electronic device.

It is another object of the present invention to provide a method for defining and recording the undershoot resistance of an electronic device.

SUMMARY OF THE INVENTION

The present invention is a method for determining the undershoot resistance of an electronic device having input and output pins. The method comprises the steps of selecting an input pin to test, providing a high voltage to at least one nonselected input pin, applying a negative voltage spike to the selected input pin, and monitoring output pins not logically connected to the input pin for disturbances in their output voltage levels.

According to another form of the present invention, the method further comprises incrementally changing the high voltage level, and the amplitude and pulse width of the negative voltage spike.

According to yet another form of the present invention, if any pin has a disturbance in its output voltage, the method further comprises recording the high voltage, the negative voltage spike amplitude and pulse width.

BRIEF DESCRIPTION OF THE DRAWINGS

FIGS. 1A and 1B are shmoo plots recording the undershoot resistance of an exemplary electronic device.

FIGS. 2A-2C form a flow chart illustrating a method according to one form of the present invention.

DESCRIPTION OF A PREFERRED EMBODIMENT

The present invention is a method for determining the undershoot resistance of an electronic device. Equipment for automatically testing electronic devices are well known in the industry. The present invention lends itself to being conducted on automatic test equipment. For example, the present invention may be practiced on a Sentry VII automatic test machine. However, the present invention is not limited to such machines and can alternatively be conducted manually, as will become clear from the following description.

An electronic device to be tested will have input and output pins. According to the present method, one input pin at a time is selected for testing. Although it is possible to test two or more input pins simultaneously, for clarity the following description assumes input pins are tested sequentially.

Output pins which have a logical connection to the input pin being tested are masked so that their outputs will not interfere with the testing process. An output pin is logically connected to an input pin when the output voltage level is dependent upon the voltage level applied to the input pin. The term "mask" as used herein is not limited to physical covering of the element being masked but refers to any noninterfering electrical isolation of the element.

Input pins which are not currently being tested with a negative voltage spike are provided with true logic signals. In other words, the particular functional test performed on the part will require specific high and low logic level signals applied to these other pins. Those pins requiring a high logic level voltage will be provided with a selected high voltage. For example, if the device being tested is a bipolar PAL device, a preferred high voltage value is about 3.0 volts. The parameters selected for the negative input voltage spike to the input pin under test are pulse width and amplitude (referred to herein as low voltage level). Again, for a bipolar PAL device a preferred value for an initial pulse width is about 10 nanoseconds and a preferred value for an initial low voltage is about −0.5 volts. A voltage spike having the selected low voltage and pulse width is applied to the selected input pin and the nonmasked output pins are monitored for any disturbance in their output level. Such disturbance can be any fluctuation in logic level.

As the testing proceeds, the test parameters are incrementally changed while continuing to monitor the nonmasked output pins. For example, the low voltage may be decremented until a predetermined low voltage limit is reached. The size of the decrements and low voltage limit will depend on the accuracy required. In a preferred embodiment for a bipolar PAL device, the low voltage is decremented from −0.5 volts to a low voltage limit of −2.0 volts in 0.1 volt decrements. After reaching the low voltage limit, the low voltage is returned to its initial value (−0.5 volts in the example)

and the pulse width is incremented one level. This new level is then held constant while the low voltage is again decremented, the output being continuously monitored for each step. When the low voltage limit is again reached, the pulse width is again incremented one level and the procedure repeated. This continues until a predetermined maximum pulse width is reached. In a preferred embodiment for a bipolar PAL device, the pulse width is incremented from 10 nanoseconds to 50 nanoseconds by 2 nanosecond increments.

If no disturbance is observed on an output pin during the above described procedure, the device is deemed to tolerate undershoot for the variable ranges tested. The low voltage and pulse width are then returned to their initial values (−0.5 volts and 10 nanoseconds in the described embodiment). The high voltage, which is applied to the input pins not being tested, is then decremented, and the preceding iterative process is repeated. After the foregoing process is complete, the high voltage is again decremented. This continues until either a predetermined minimum high voltage is reached, the device fails a test, or all desired test points have been run. In a preferred embodiment for a bipolar PAL device, the high voltage is decremented from 3.0 volts to a minimum high voltage of 2.0 volts in 0.1 volt decrements.

Each input pin to the electronic device is tested in the manner described above. Output pins which are logically connected to the pin under test are masked and the remaining output pins are monitored.

During the foregoing testing, if a disturbance is observed on an output pin a recording is made of the critical test parameters. In a preferred embodiment these include high voltage, low voltage and pulse width for that test. A preferred form of the recording is a shmoo plot such as shown in FIGS. 1A and 1B. FIG. 1A is a recording of the undershoot low voltage vs. the undershoot pulse width for a selected value of high voltage being tested. FIG. 1A is a typical shmoo plot for a device having failed an undershoot test at a high voltage of 2.1 volts. The envelope E defines a region R wherein the device exhibited undershoot related failures. FIG. 1B is a shmoo plot for the same device, tested under the minimum high voltage of 2.0 volts. Envelope E' in FIG. 1B defines a region R' much greater than region R in FIG. 1A. In general, the smaller the region R, the greater the undershoot resistance of the device.

FIG. 2 is a flowchart illustrating the method of the present invention for the specific embodiment described above. The test is started (block 10) by selecting the input pin to test (block 12). A requirement for the selection is that there be at least one output pin not logically connected to the input. Otherwise, there would be no output pins which could be meaningfully monitored for undershoot. The selected input pin is connected to an undershoot bus (block 14) or other contact through which the negative voltage spike will be supplied to the input pin. Outputs which are logically connected to the selected input are masked (block 16). Initial test parameters are set (block 18) with the values given. The high voltage is applied to at least one of the nonselected input pins—input pins requiring a logical high signal. Clearly, these values may vary depending upon the type of device under test and any test requirements such as emulating a specific environment which could be present on a printed circuit board.

The functional test (block 20) is then performed—a negative voltage spike with the specified amplitude and pulse width is applied through the undershoot bus to the input pin, and the nonmasked output pins are monitored. If none of the monitored output pins glitch (block 22), the low voltage is decremented by 0.1 volts (block 26). If the low voltage is not less than the low voltage limit then a functional test is again performed (block 20). If the low voltage is less than the low voltage limit then the pulse width is incremented (block 30) and the low voltage is reset to its initial value. If the pulse width does not exceed the maximum pulse width (block 32), a functional test is performed (block 20). If the pulse width does exceed the maximum pulse width and no glitches have yet been observed (block 34) then the high voltage is decremented and the low voltage and pulse width are reset (block 36). If the high voltage is not less than the minimum high voltage (block 38), the functional test is performed. If the high voltage is less than the minimum high voltage, no undershoot has been observed (block 40).

Referring back to block 22, if a glitch on the output has been observed, the parameters associated with that test are saved (block 42). In order to generate a shmoo plot, low voltage and pulse width for other negative pulses for the same high voltage must be obtained. Accordingly, low voltage will continue to be decremented (block 26) and pulse width incremented (block 30) until the low voltage limit and the maximum pulse width are attained. At this point, since the output has glitched at least once (block 34), a shmoo plot using the saved parameters will now be generated (block 24). For example, the shmoo plot shown in FIG. 1A shows a plot of low voltage vs. pulse width for a fixed input voltage of 2.1 volts. In order to make a meaningful comparison between similar electronic devices, a second shmoo plot may be generated for the minimum high voltage. (See FIG. 1B) Thus, if the first shmoo plot was generated for other than the minimum high voltage (block 44), the high voltage is set to the minimum value (block 46), the low voltage and pulse width are reset, and a set of values generated.

After a selected input pin has been tested, the next pin to be tested is selected (block 50) and the test procedure is restarted (block 10). After the last pin in the input pin array has been tested (block 48) the testing for the subject device is complete (block 52).

The following table shows the range of values for the specific example in the preceding discussion.

| low voltage | pulse width | high voltage | pin |
| --- | --- | --- | --- |
| −0.5 | 10 ns | 3.0 | 1 |
| −0.6 | 12 ns | 2.9 | 2 |
| . | . | . | . |
| . | . | . | . |
| . | . | . | . |
| −2.0 | 50 ns | 2.0 | n |

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows.

What is claimed is:

1. A method for determining the undershoot resistance of an electronic device having input and output pins comprising the steps of:
   a. selecting an input pin to test;
   b. masking output pins logically connected to said input pin;
   c. providing a first high voltage to at least one nonselected input pin;
   d. selecting a first pulse width;
   e. selecting a first low voltage;
   f. applying a voltage spike having said low voltage and pulse width to said selected input pin; and
   g. monitoring nonmasked output pins for disturbances in their output voltage levels.
2. The method of claim 1 further comprising:
   h. recording said high voltage, low voltage, and pulse width if any pin has a disturbance in its output voltage.
3. The method of claim 2 further comprising:
   i. decrementing said low voltage and repeating steps f through h.
4. The method of claim 3 wherein said step i is repeated until a predetermined low voltage limit is reached.
5. The method of claim 4 further comprising:
   j. incrementing said pulse width, selecting said first low voltage, and repeating steps f through i until said predetermined low voltage limit is reached.
6. The method of claim 5 wherein said step j is repeated until a predetermined maximum pulse width is reached.
7. The method of claim 6 further comprising:
   k. decrementing said high voltage, selecting said first pulse width and said first low voltage, and repeating steps f through j until said predetermined low voltage limit is reached and said predetermined maximum pulse width is reached.
8. The method of claim 7 wherein said step k is repeated until a predetermined minimum high voltage is reached.
9. The method of claim 8 further comprising:
   1. selecting another input pin to test, masking input pins logically connected to said another input pin, providing said first high voltage to at least one nonselected input pin, selecting said first pulse width and said first low voltage and repeating steps f through k until said predetermined low voltage limit is reached, said predetermined maximum pulse width is reached, and said predetermined minimum high voltage is reached.
10. The method of claim 9 wherein said step 1 is repeated until all input pins have been tested.
11. The method of claim 10 wherein said first high voltage is about 3.0 volts, said first pulse width is about 10 nanoseconds, and said first low voltage is about $-0.5$ volts.
12. The method of claim 11 wherein said predetermined minimum high voltage is about 2.0 volts, said predetermined maximum pulse width is about 50 nanoseconds, and said predetermined low voltage limit is about $-2.0$ volts.
13. The method of claim 12 wherein said low voltage is decremented by 0.1 volts, said pulse width is incremented by 2 nanoseconds, and said high voltage is decremented by 0.1 volts.
14. A method for determining the undershoot resistance of an electronic device having input and output pins comprising the steps of:
   selecting an input pin to test;
   providing a high voltage to at least one nonselected input pin;
   applying a negative voltage spike to said selected input pin; and
   monitoring output pins not logically connected to said selected input pin for disturbances in their output voltage levels.
15. The method of claim 14 further comprising:
   incrementally changing said high voltage, and the amplitude and pulse width of said negative voltage spike.
16. The method of claim 15 further comprising:
   recording said high voltage, said negative voltage spike amplitude and pulse width if any pin has a disturbance in its output voltage.
17. The method of claim 16 wherein said high voltage is a predetermined minimum value, said amplitude is a predetermined low value, and said pulse width is a predetermined maximum value.

* * * * *

UNITED STATES PATENT AND TRADEMARK OFFICE
CERTIFICATE OF CORRECTION

PATENT NO. : 5,006,807
DATED : April 9, 1991
INVENTOR(S) : Steven M. Blum It is certified that error appears in the above-identified patent and that said Letters Patent is hereby corrected as shown below:

On the title page:
   Item: --[73] Assignee: NCR Corporation, Dayton, Ohio--

Item [56]: --Attorney, Agent, or Firm--Wilbert Hawk, Jr.; Douglas S. Foote; James M. Stover--

Signed and Sealed this

First Day of March, 1994

Attest:

BRUCE LEHMAN

*Attesting Officer*      *Commissioner of Patents and Trademarks*